(12) United States Patent
Huebschman

(10) Patent No.: US 8,907,686 B2
(45) Date of Patent: Dec. 9, 2014

(54) METHOD AND APPARATUS FOR ACCELERATING DEVICE DEGRADATION AND DIAGNOSING THE PHYSICAL CHANGES OF THE DEVICE DURING THE DEGRADATION PROCESS

(75) Inventor: Benjamin D. Huebschman, Beltsville, MD (US)

(73) Assignee: The United States of America as represented by the Secretary of the ARmy, Washington, DC (US)

(*) Notice: Subject to any disclaimer, the term of this patent is extended or adjusted under 35 U.S.C. 154(b) by 457 days.

(21) Appl. No.: 13/364,556

(22) Filed: Feb. 2, 2012

(65) Prior Publication Data

US 2013/0200908 A1   Aug. 8, 2013

(51) Int. Cl.
*G01R 31/00* (2006.01)

(52) U.S. Cl.
USPC ........................................ 324/750.01

(58) Field of Classification Search
CPC ............. G01R 31/3025; G01R 31/00; G01R 31/2621; G01R 31/2648; G01R 31/28
See application file for complete search history.

(56) References Cited

U.S. PATENT DOCUMENTS

| | | | |
|---|---|---|---|
| 3,939,415 A | | 2/1976 | Terasawa |
| 4,669,051 A | * | 5/1987 | Barr, IV ........................ 702/191 |
| 5,089,782 A | * | 2/1992 | Pike et al. .................... 324/623 |
| 5,351,001 A | | 9/1994 | Kornrumpf et al. |
| 5,381,103 A | | 1/1995 | Edmond et al. |
| 5,650,336 A | | 7/1997 | Eriguchi et al. |
| 6,097,200 A | | 8/2000 | Turlapaty et al. |
| 6,633,177 B1 | | 10/2003 | Okada |

* cited by examiner

*Primary Examiner* — Tung X Nguyen
(74) *Attorney, Agent, or Firm* — Alan I. Kalb (57) ABSTRACT

Embodiments of the present invention comprise methods and apparatus for testing devices. In some embodiments, a method for testing a device includes operating the device in a stress inducing mode using a first set of conditions for a first period of time; determining a first value for a plurality of device parameters after the first period of time; operating the device in the stress inducing mode using the first set of conditions for a second period of time; determining a second value for the plurality of device parameters after the second period of time; and determining if one or more components of the device has at least one of failed or physically changed by comparing the first and second values for the plurality of device parameters.

20 Claims, 5 Drawing Sheets

METHOD AND APPARATUS FOR ACCELERATING DEVICE DEGRADATION AND DIAGNOSING THE PHYSICAL CHANGES OF THE DEVICE DURING THE DEGRADATION PROCESS

GOVERNMENT INTEREST

Governmental Interest—The invention described herein may be manufactured, used and licensed by or for the U.S. Government.

FIELD OF INVENTION

Embodiments of the present invention generally relate to device testing and, more particularly, to methods and apparatus for testing a device, such as a transistor, amplifier or the like.

BACKGROUND OF THE INVENTION

The testing of a device, such as one including a transistor, amplifier, circuit or the like may be performed by operating the device under a stressed condition, such as an elevated temperature, typical operating conditions, or the like, and monitoring the device until it reaches some defined criteria of failure. Failure may be arbitrarily defined, such as when the device operates at lower efficiency or the like. Unfortunately, testing a device as discussed above may be able to determine the mean time to failure of the device, but may not be able to diagnose the physical changes within the device as it degrades.

Therefore, there is a need in the art for improved methods and apparatus for testing a device.

BRIEF SUMMARY OF THE INVENTION

Embodiments of the present invention comprise methods and apparatus for testing devices. In some embodiments, a method for testing a device includes operating the device in a stress inducing mode using a first set of conditions for a first period of time; determining a first value for a plurality of device parameters after the first period of time; operating the device in the stress inducing mode using the first set of conditions for a second period of time; determining a second value for the plurality of device parameters after the second period of time; and determining if one or more components of the device has at least one of failed or physically changed by comparing the first and second values for the plurality of device parameters.

In some embodiments, an apparatus for testing a device includes a testing platform for testing a device when present on the testing platform, the testing platform having one or more power supplies for providing power to the device and a first switch to couple to an input of the device and a second switch to couple to an output of the device, wherein the first and second switches switch the testing platform between a first mode and a second mode; an RF power source coupled to the testing platform via the first switch for use during the first mode; and a vector network analyzer coupled to the testing platform via the first and second switches for use during the second mode, wherein the vector network analyzer is used to perform S-parameter measurements on a device when present on the testing platform.

Other and further embodiments of the present invention are discussed below.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE INVENTION

Embodiments of the present invention comprise a method and apparatus for testing a device. The inventive methods and apparatus advantageously allow for the determination of one or more failure points or changes of a physical nature in a device under test (DUT). For example, such a determination may identify a specific element or elements of the device that fail or change in some physical manner.

Figure 1:
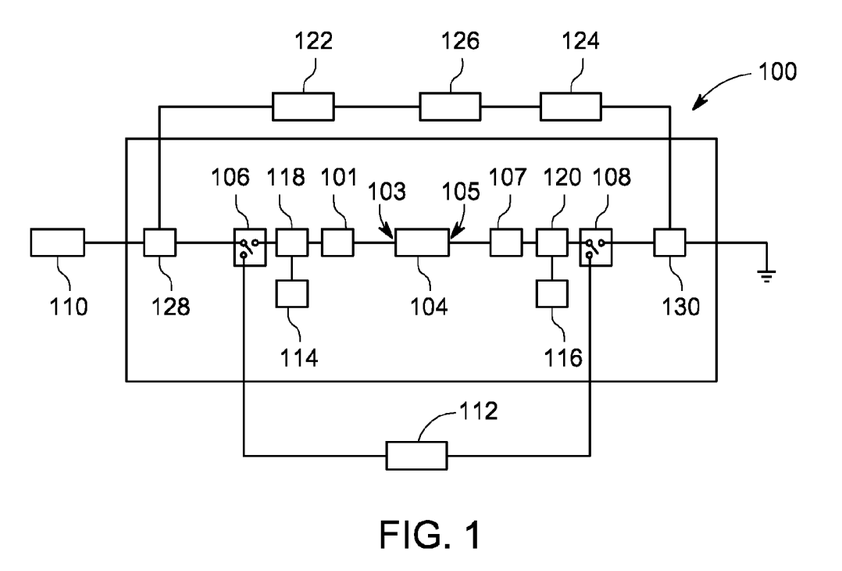
FIG. 1 depicts a schematic view of an apparatus for testing a device in accordance with some embodiments of the present invention.

FIG. 1 depicts an apparatus 100 for testing a device in accordance with some embodiments of the present invention. The apparatus 100 may include a testing platform 102 for testing a device 104 when present on the testing platform 102. The testing platform 102 may include a first switch 106 and a second switch 108, wherein the first and second switches 106, 108 switch the testing platform 102 between a first mode and a second mode. Exemplary first and second switches 106, 108 may include Agilent 8767M RF switches, available from Agilent Technologies of Santa Clara, Calif. However, any suitable switches may be utilized. The first switch 106 may be coupled to an input 103 of the device 104 and the second switch 108 may be coupled to an output 105 of the device. A first matching network 101 may be disposed between the first switch 106 and the input 103 of the device 104 when present on the testing platform 102. Similarly, a second matching network 107 may be disposed between the second switch 108 and the output 105 of the device 104 when present on the testing platform 102.

The first mode may be a stress mode, where the device 104 may be operated under a first set of conditions, and the second mode may be a device characterization mode, where parameters, such as S-parameters of the device are measured. For example, an RF power source 110 may be coupled to the testing platform 102 via the first switch 106 for use during the first mode. An exemplary RF power source may include an Agilent E8257D analog signal generator available from the aforementioned. Agilent Technologies. For example, a vector network analyzer 112 may be coupled to the testing platform 102 via the first and second switches 106, 108 for use during the second mode, wherein the vector network analyzer is used to perform S-parameter measurements on the device 104 when present on the testing platform 102. An exemplary vector network analyzer may include an Agilent E8364A PNA available from the aforementioned Agilent Technologies; however, any suitable vector network analyzer may be utilized.

The testing platform 102 may include additional elements for testing the device 104. For example, and for biasing the device 104 and making direct current measurements, the testing platform 102 may include one or more power supplies for providing power to the device 104. As illustrated in FIG. 1, the one or more power supplies may include a first power supply 114 coupled to the input 103 of the device 104 and a second power supply 116 coupled to the output 105 of the device 104. Although illustrated separately in FIG. 1, the first and second power supplies 114, 116 may be part of a combined system that includes several power supplies and is further capable of making direct current (DC) measurements. An exemplary combined system having the first and second power supplies may include an HP 4142B Modular DC source/Monitor available from Hewlett-Packard of Palo Alto, Calif. An exemplary first power supply 114 may include an HP41421B Medium Power Source/Monitor Unit available from the aforementioned Hewlett-Packard. An exemplary second power supply 116 may include an HP41420A High Power Source/Monitor Unit available from the aforementioned Hewlett-Packard. However, any suitable first and second power supplies 114, 116 may be utilized.

Each of the first and second power supplies 114, 116 may be coupled to the respective input and output 103, 105 via corresponding bias Ts 118, 120. For example each bias T 118, 120 may be a device that combines the RF power source 110 and the first and second power supplies 114, 116 such that RF power and DC power can be applied to the device 104 simultaneously.

For example, RF power from the RF power source 110 may be monitored at the input 103 and the output 105 by a first power sensor 122 and second power sensor 124, respectively. As illustrated in FIG. 1, the first and second power sensors 122, 124 may be coupled to a power meter 126 which monitors the first and second power sensors 122, 124. Exemplary first and second power sensors may include Agilent 8487A Power Sensors available from the aforementioned Agilent Technologies. An exemplary power meter may include an Agilent 438A Power Meter available from the aforementioned Agilent Technologies. Directional couplers may be used to split the RF power such that a portion of the RF incident on the input 103 or received from the output 105 can be directed to the first and second power sensors 122, 124 respectively. For example, as illustrated in FIG. 1 a first directional coupler 128 may be disposed between the RF power source 110 and the first switch 106 and a second directional coupler 130 may be disposed between the second switch 108 and ground. Exemplary first and second directional couplers 128, 130 may include Agilent 87301E directional couplers available from the aforementioned Agilent Technologies.

Additional elements associated with providing and monitoring RF power are possible. For example, (not shown) one or more amplifiers, band pass filters or the like may be disposed between the RF power source 110 and the first switch 106. For example, the amplifier may include a traveling wave tube (TWT) microwave amplifier or the like. Exemplary amplifiers include a Hughes 8010H12F000 TWT Microwave Amplifier available from Hughes Electrodynamics.

Figure 2:
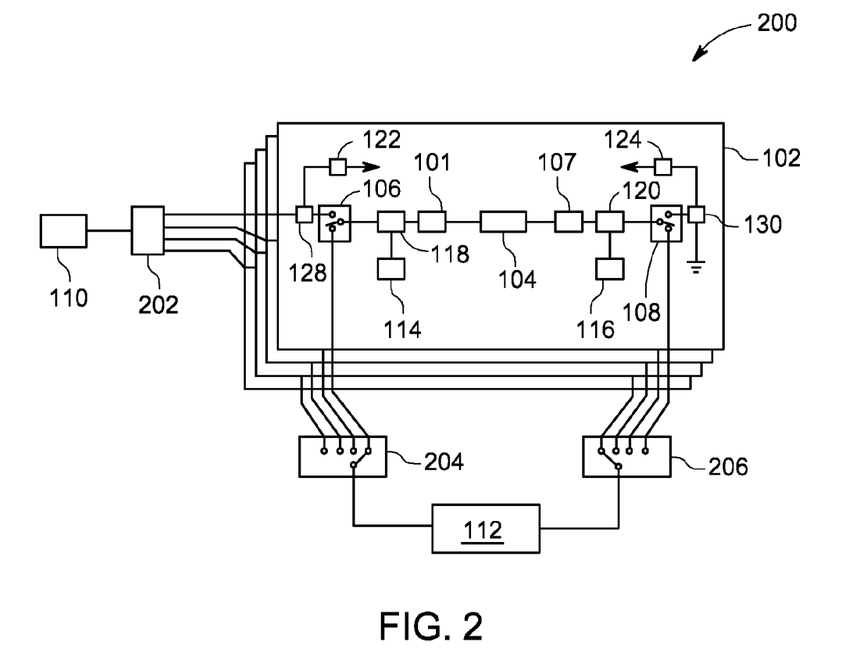
FIG. 2 depicts a schematic view of an apparatus for testing a device in accordance with some embodiments of the present invention.

In some embodiments, the apparatus may include a plurality of testing platforms 102, such as illustrated in FIG. 2 for an apparatus 200. The apparatus 200 may include an RF power divider 202 to divide RF power provided by the RF power source to each of the plurality of testing platforms 102 via each of the plurality of first switches 106, an input switch 204 to couple an output of the vector network analyzer 112 to each of the plurality of first switches 106 of each of the plurality of testing platforms 102, and a output switch 206 to couple an input of the vector network analyzer 112 to each of the plurality of second switches 108 of each of the plurality of testing platforms 102. Further, (not shown) switches and/or power dividers may similarly utilized to coupled the first and second power sensors 122, 124 on each of the plurality of testing platforms 102 to the power meter 126. In operation, the apparatus 200 may be utilized to each of the plurality of test platforms 102 in parallel in the first mode and to operate each of the plurality of test platforms 102 in series in the second mode. Accordingly, the first mode may be applied simultaneously to each of the plurality of test platforms 102 and the second mode, such as where S-parameter measurements are made using the vector network analyzer 112, may be utilized by one of the plurality of test platforms 102 as a given time.

Figure 3:
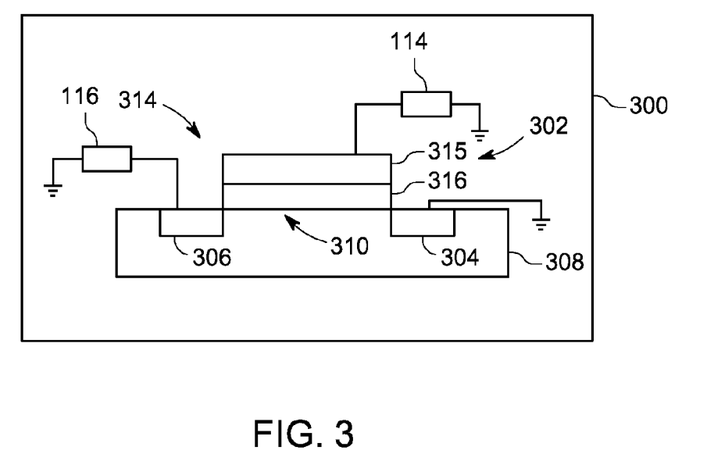
FIG. 3 depicts a cross sectional view of an exemplary device in accordance with some embodiments of the present invention.

The device 104 may be any suitable device such as including a transistor, amplifier or the like. One exemplary device that may be tested in the inventive apparatus discussed above may be a device 300 depicted in FIG. 3. The device 300 may include a transistor 302, such as a field effect transistor or the like, as depicted in cross sectional view in FIG. 3. For example, the transistor 302 may include a source region 304 and a drain region 306 disposed in a substrate 308. A channel region 310 may be disposed in the substrate 308 between the source and drain regions 304, 306. A gate 314 may be disposed above the channel 310. The gate 314 may include a gate electrode 315 separated from the channel by a dielectric layer 316. In operation, the drain region 306 and the gate 314 may be separately biased relative to the source region 304. For example, when sufficient bias is applied between the gate 314 and the source 304, current may flow between the source and drain regions 304, 306 via the channel 310. For example, in the context of the device 104 as discussed above, the input 103 may be a power applied to the gate 314 and the output 105 may be a power resulting from the flow of current between the source and drain regions 304, 306. In some embodiments, the transistor 302 may be a gallium nitride (GaN) high electron mobility transistor (HEMT) operated in a class AB mode at a bias of about 20V on the drain region 306 with a drain current at about 20% of a peak saturation current. In some embodiments, the drain current may be about 100 mA, for example, such as for 500 micron GaN HEMTs. However, the above device 300 and configurations described therewith are merely exemplary and other devices and configuration may be utilized with the present invention.

Other suitable embodiments of the device 104 may include bipolar junction transistors, heterojunction bipolar transistors, metal oxide semiconductor transistors, junction gate field effect transistors (JFETs), metal semiconductor field effect transistors (MESFETs), other field effect transistors, switches including micro-electromechanical (MEMs) switches, vacuum tube devices as well as other transistor and switching technologies. These transistors may be fabricated from any semiconducting or conductor material or combinations of a variety of materials.

Figure 4:
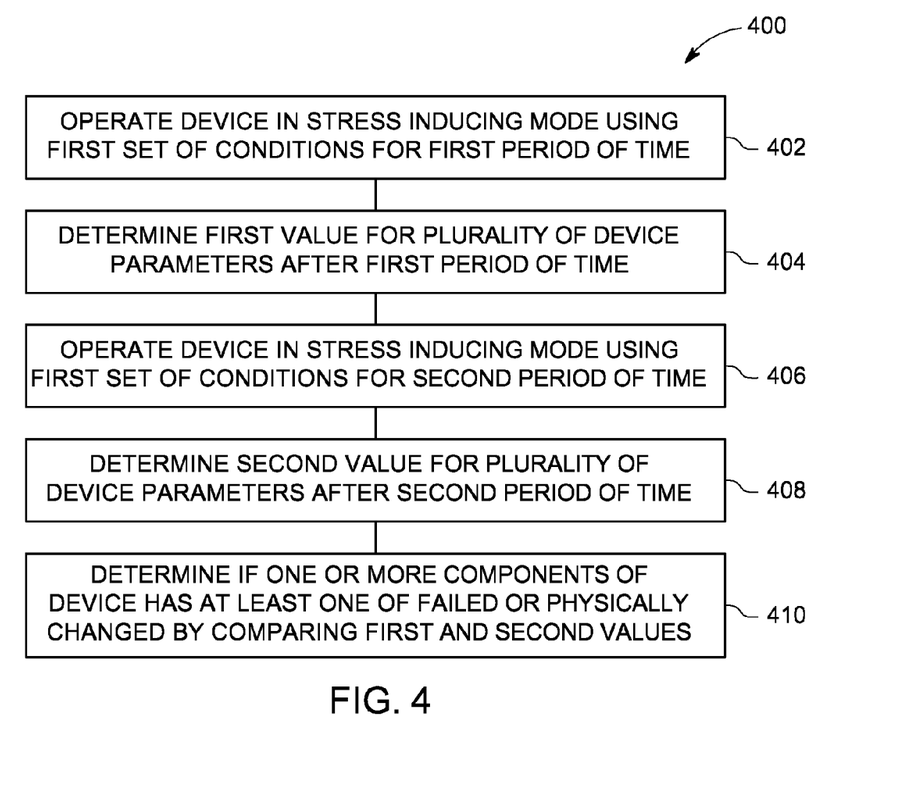
FIG. 4 depicts a flow chart of a method for testing a device in accordance with some embodiments of the resent invention.

FIG. 4 depicts a flow chart of a method 400 for testing a device in accordance with some embodiments of the present invention. The method 400 is described below in accordance with the embodiments of the device 300 illustrated in FIG. 3 and the apparatus 100 illustrated in FIG. 1. In some embodiments, the method 400 may be performed from initiation to completion without any intervention by the operator. The method 400 begins at 402 by operating a device (e.g., device 300) in a stress inducing mode using a first set of conditions for a first period of time. For example, the first period of time may range from about 5 to 6 hours. For example, the apparatus 100 may be in the first mode (e.g., a stress testing mode) when the device is operated in the stress inducing mode at 402. The stress inducing mode may be compression or some other operating modes selected by the operator. The operating mode used to stress the device may include one or more of Class A, Class AB, Class B, high voltage, high current, pulsed operation, forward gate current, or any other operating mode designed to accelerate degradation, reproduce device operation, isolate a specific failure mechanism as well as other operating modes.

Figure 5:
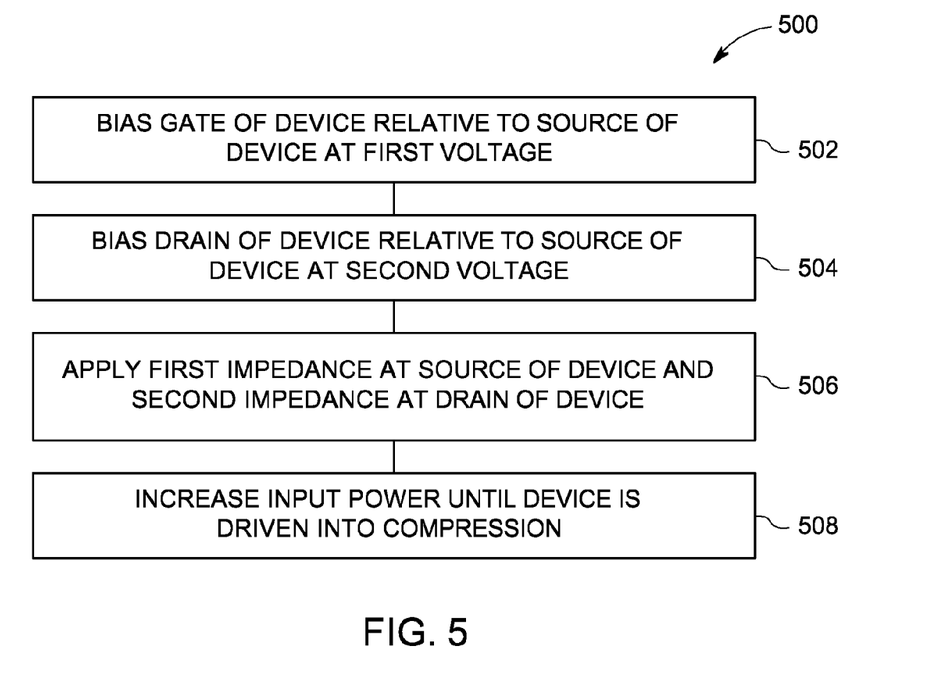
FIG. 5 depicts a flow chart of a method for operating a device in a stress inducing mode using a first set of conditions in accordance with some embodiments of the present invention.

One exemplary method 500 for operating the device in the stress inducing mode using the first set of conditions for the first period of time at 402 is depicted in FIG. 5 in accordance with some embodiments of the present invention. The method 500 begins at 502 by biasing the gate 314 of the transistor 302 relative to the source 304 of the transistor 302 at a first voltage. For example, the gate may be biased using the first power supply 114 as discussed above. The first voltage may range from about −3 to about −5 Volts or a voltage selected by the operator that is appropriate for the specific device under test At 504, the drain 306 of the transistor 302 may be biased relative to the source 304 of the transistor 302 at a second voltage. For example, the drain 306 may be biased using the second power supply 116 as discussed above. The second voltage may range from about 10 to about 50 Volts or a voltage selected by the operator that is appropriate for the specific device under test. For example, the first and second voltages should be kept at set values during operation of the device. If the first and/or second voltages deviate from the set values during operation of the device, it may be indicative of the first and/or second power supplies reaching a current limit and may indicate that the device 300 has failed. In some embodiments, the voltage may be held constant or the operator may choose to hold the drain current constant and allow the gate voltage to float.

At 506, a first impedance may be set at the gate 314 and a second impedance may be set at the drain 306 of the transistor 302. For example, the first impedance may be set using the first matching network 101 and the second impedance may be set using the second matching network 107.

At 508, an input power may be increased on the gate 314 until the device is driven into the stress inducing mode. For example, the input power may be provided by the RF power source 110. The input power may be set to any desired radio frequency (RF) level. During the first period of time while the device 300 is operating in the stress inducing mode, one or more characteristics of the device may be measured at intervals during the first period of time. For example, the intervals may range from about 0.5 to about 20 minutes or whatever interval of time is appropriate for the DUT, the test conditions and the components of the test apparatus. In some embodiments, each interval is about 5 minutes. The one or more characteristics of the device that may be measured after each interval may include one or more of a drain voltage ($V_{DS}$), a gate voltage ($V_{GS}$), an input power ($P_{in}$), a drain current ($I_{DS}$), a gate current ($I_{GS}$), an output power ($P_{out}$), a gain, a drain efficiency, or a power added efficiency. For example, as discussed above, if at least one of the gate or drain voltage changes, it may indicated that the device has failed and the operation of the device may be stopped. Alternatively, the device may continue to be operated even if the device has failed, for example, to determine additional failure mechanisms in the device.

Further, a comparison may be made between the measured one or more characteristics at successive intervals during the first period of time to determine if a calibration of a system (e.g., apparatus 100) being used to operate the device has drifted from a desired value. In some embodiments, the operation of the device may be terminated if it is determined that the system has drifted from the desired value and the system may be re-calibrated. After the system is re-calibrated, the operation of the device may be re-initiated, for example, using the procedure discussed above in method 500, to operate the device in the stress inducing mode using the first set of conditions and continue the operation until the first period of time is reached.

Returning to method 400 at 402, a first value for a plurality of device parameters may be determined after the first period has ended. For example, the first value for a plurality of device parameters may be calculated from a model, such as a small signal model or a large signal model that may be representative of the device under test. Any suitable small signal or large signal models may be used to represent the physical state of the DUT. The first value may be a plurality of values, for example, such as one or more value for each device parameter in the model to represent one or more components of the device. Monitoring how each calculated value changes between success periods, such as the first period and a second period (discussed below) may indicate which components of the device under test have failed or change in some physical manner.

Figure 6A:
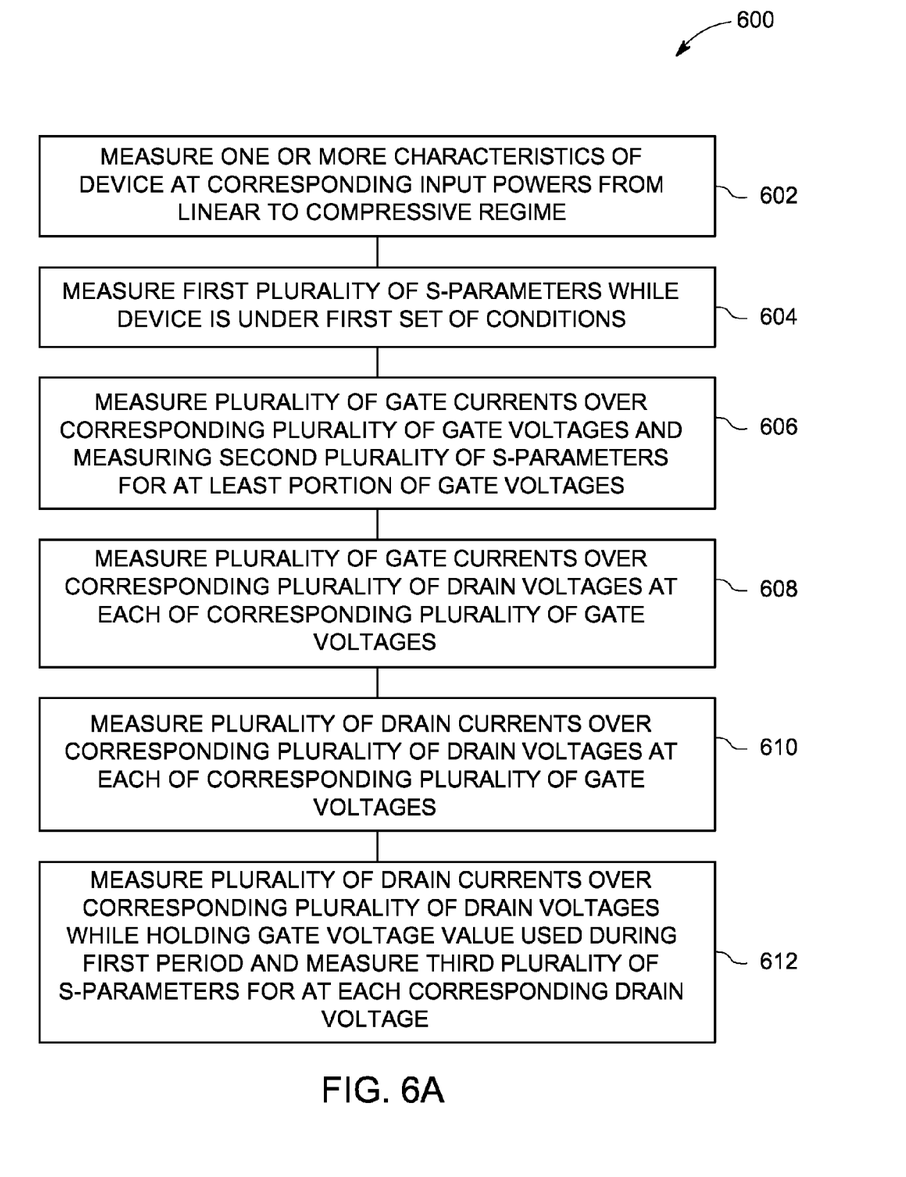
FIGS. 6A and 6B depict a flow chart of a method for determining a value of a plurality of device parameters in accordance with some embodiments of the present invention.
Figure 6B:
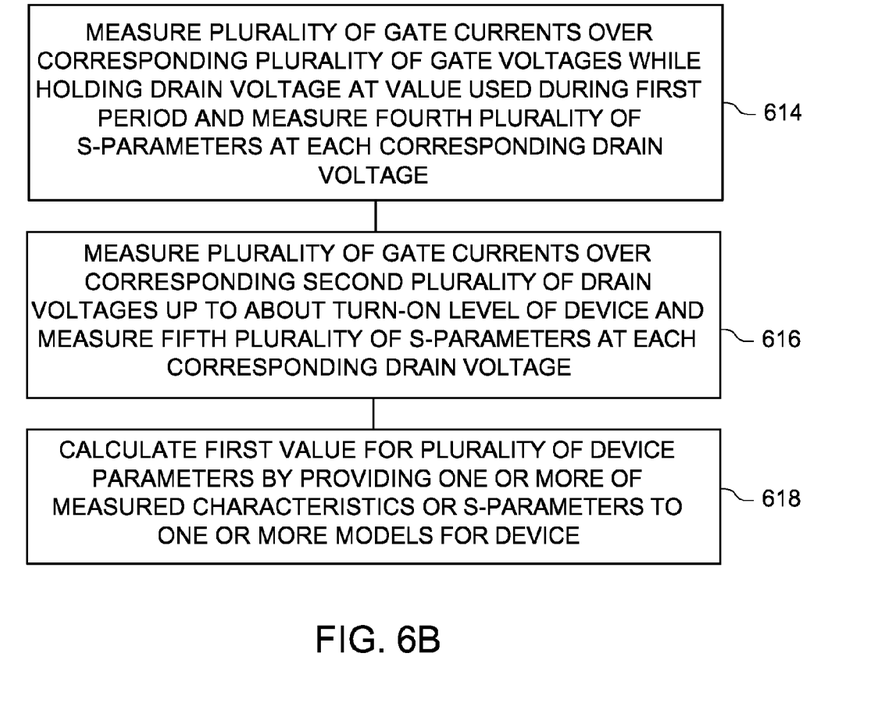

The first value for a plurality of device parameters may be determined after the first period of time using a method 600 depicted in FIGS. 6A and 6B in accordance with some embodiments of the present invention. For example, the method 600 may be at 602 by measuring the one or more characteristics of the device at corresponding input powers from a linear to compressive regime. For example, the one or more characteristics may include one or more of a drain voltage ($V_{DS}$), a gate voltage ($V_{GS}$), an input power ($P_{in}$), a drain current ($I_{DS}$), a gate current ($I_{GS}$), an output power ($P_{out}$), a gain, a drain efficiency, or a power added efficiency, and the source power at each input power. For example, the one or more characteristics may be measured while the device is at the first set of conditions, e.g., the first and second voltages and the first and second impedances as discussed above. In operation, the plurality of input powers may be provided to operate the device from a linear regime to compression and the one or more characteristics of the device may be measured at each corresponding input power from the linear regime to compression. After the input power is sweep at 602, the input power may be reduced below a minimum level used during 602 and then the RF power source 110 may be turned off.

At 604, a first plurality of S-parameter measures may be made on the device while maintaining the device at the first set of conditions. For example, in operation, the RF power source 110 may be off as discussed above and the first and second switches 106, 108 may be switched such that the vector network analyzer 112 may be coupled to the device. Using the vector network analyzer 112, the first plurality of S-parameter measurements may be made while the device is maintained at the first set of conditions.

At 606, gate voltage measurements may, be performed. For example, the device may be turned off after the first plurality of S-parameters is measured. For example, turning off the device may include applying a negative voltage to the gate to reduce the drain current to a leakage level and reducing the drain voltage to about zero after the drain current has been reduced to the leakage level. Alternatively, a positive voltage may be applied to turn off the device, for example, when a p-type channel device is used. At 606, after the drain voltage is about zero, a plurality of gate currents may be measured over a corresponding plurality of gate voltages. For example, the gate voltages may be supplied by the first power supply 114. The gate voltages may range from a negative bias to a positive bias. A second plurality of S-parameters may be measured for at least a portion of the corresponding plurality of gate voltages.

At 608 and 610, DC characteristics of the device may be measured. For example, at 608, the drain current may be measured over a plurality of drain voltages at each of a corresponding plurality of gate voltages. At 610, the gate current may be measured over a plurality of drain voltages at each of a corresponding plurality of gate voltages.

At 612-616, S-parameter measurements may be made in various regions of operation of the device. For example, at 612, a drain voltage sweep may be performed. A drain voltage sweep may include measuring the drain current over the plurality of voltages while holding the gate voltage at a value (e.g., the second voltage) during operation of the device over the first period and measuring a third plurality of S-parameters at each corresponding drain voltage of the plurality of drain voltages. At 614, a gate voltage sweep may be performed. A gate voltage sweep may include measuring the drain current over the plurality of gate voltages while holding the drain voltage at a value (e.g., the first voltage) used during operation of the device over the first period and measuring a fourth plurality of S-parameters at each corresponding gate voltage of the plurality of gate voltages. At 616, a low voltage sweep is performed to characterize the turn on characteristics of the device. For example, the low voltage sweep may include measuring the drain current over a second plurality of drain voltages up to about a turn-on level of the device and measuring a fifth plurality of S-parameters at each corresponding drain voltage of the second plurality of drain voltages.

At 618, the first value for the plurality of device parameters may be calculated. For example, the data obtained from the various steps of the method 600 discussed above may be provided to one or more models for the device to determine the first value. For example, data may include the one or more measured device characteristics or S-parameters as discussed above.

Returning to the method 400, at 406, the device may be operated in the stress inducing mode using the first set of conditions for a second period of time. Operation of the device at the second period of time may occur after the first value of the plurality of device parameters has been determined. For example, step 406 may be substantially similar to step 402, and the device may be operated as discussed above using the method 500.

At 408, a second value for the plurality of device parameters may be determined after the second period of time. For example, step 408 may be substantially similar to step 404, and the second value may be determined using the method 600 as discussed above.

At 410, a comparison may be made between the first and second values for the plurality of device parameters to determine if one or more components of the device have failed. For example, one or more of the plurality of device parameters may correspond to one or more of the components of the device. By comparing how the value of each device parameter changes between the first period of time and the second period of time, it can be determined from the magnitude of the change whether one or more components of the device have failed and more specifically pin point particularly failure point.

In some embodiments, where none of the one or more components has failed after the comparison of the first and second values, the device may be operating the device in the stress inducing mode using the first set of conditions for a third period of time and a third value for the plurality of device parameters by characterizing the device after the third period of time. A comparison may be made between the second and third values for the plurality of device parameters to determine if one or more components of the device have failed. Further, if the failure of a component has not been determined after the third period of time, the method steps of operating the device in the stress inducing mode and determining a value for the plurality of device parameters may be repeated for any suitable number of iterations until a failure in the device has been detected.

In some embodiments, when at least one of the one or more components has failed after the comparison of the first and second values, the device may still be operated in the stress inducing mode using the first set of conditions for the third period of time and a third value for the plurality of device parameters may be determined after the third period of time. For example, although at least one of the one or more components has failed during the second period of time, a comparison of the second and third values for the plurality of device parameters may determine if at least another of the one or more components of the device has failed during the third period of time.

Various elements, devices, modules and circuits are described above in associated with their respective functions. These elements, devices, modules and circuits are considered means for performing their respective functions as described herein.

While the foregoing, is directed to embodiments of the present invention, other and further embodiments of the invention may be devised without departing from the basic scope thereof, and the scope thereof is determined by the claims that follow.

The invention claimed is:

1. A method for testing a device, comprising:
operating the device in a stress inducing mode using a first set of conditions for a first period of time;
determining a first value for a plurality of device parameters after the first period of time;
operating the device in the stress inducing mode using the first set of conditions for a second period of time;
determining a second value for the plurality of device parameters after the second period of time; and
determining if one or more components of the device has at least one of failed or physically changed by comparing the first and second values for the plurality of device parameters.

2. The method of claim 1, wherein none of the one or more components has failed after the comparison of the first and second values, and further comprising:
operating the device in the stress inducing mode using the first set of conditions for a third period of time;
determining a third value for the plurality of device parameters by characterizing the device after the third period of time; and determining if one or more components of the device has failed or physically changed by comparing the second and third values for the plurality of device parameters.

3. The method of claim 1, wherein at least one of the one or more components has at least one of failed or physically changed after the comparison of the first and second values, and further comprising:
operating the device in the stress inducing mode using the first set of conditions for a third period of time;
determining a third value for the plurality of device parameters after the third period of time; and
determining if at least another of the one or more components of the device has at least one of failed or physically changed by comparing the second and third values for the plurality of device parameters.

4. The method of claim 1, wherein at least one of the one or more components of the device has physically changed after the second period of time, and further comprising:
determining a rate of physical change in the at least one of the one or more components of the device.

5. The method of claim 1, wherein the device is a transistor and wherein operating the device in the stress inducing mode using the first set of conditions at the first period of time further comprises:
biasing a gate of the transistor relative to the source of the transistor at a first voltage;
biasing a drain of a transistor relative to a source of the transistor at a second voltage;
setting a first impedance at the gate of the transistor and a second impedance at the drain of the transistor; and
increasing an input power on the gate until the device is driven into the stress inducing mode, wherein the input power having a desired RF frequency.

6. The method of claim 4, wherein operating the device in the stress inducing mode using the first set of conditions at the first period of time further comprises:
measuring one or more characteristics of the device at intervals during the first period of time, the one or more characteristics including one or more of a drain voltage ($V_{DS}$), a gate voltage ($V_{GS}$), an input power ($P_{in}$), a drain current ($I_{DS}$), a gate current ($I_{GS}$), an output power ($P_{out}$), a gain, a drain efficiency, or a power added efficiency.

7. The method of claim 6, wherein operating the device in the stress inducing mode using the first set of conditions at the first period of time further comprises:
comparing the measured one or more characteristics at successive intervals during the first period of time to determine if a calibration of a system being used to operate the device has drifted from a desired value; and
terminating the operation of the device and re-calibrating the system if the system has drifted from the desired value; and
re-initiating operation of the device in the stress inducing mode using the first set of conditions after the system is re-calibrated and operating the device in the stress inducing mode until the first period of time is reached.

8. The method of claim 1, wherein determining the first value for a plurality of device parameters after the first period of time further comprises:
providing a plurality of input powers to operate the device from a linear regime to compression; and
measuring one or more characteristics of the device at each corresponding input power from the linear regime to compression.

9. The method of claim 8, wherein determining the first value for the plurality of device parameters after the first period of time further comprises:
operating the device under the first set of conditions; and
measuring a first plurality of S-parameters while the device is in operation under the first set of conditions.

10. The method of claim 9, wherein the device includes a transistor and wherein determining the first value for the plurality of device parameters after the first period of time further comprises:
turning off the device;
measuring a plurality of gate currents over a corresponding plurality of gate voltages; and
measuring a second plurality of S-parameters for at least a portion of the corresponding plurality of gate voltages.

11. The method of claim 10, wherein turning off the device, further comprising:
applying a negative voltage to the gate to reduce a drain current to a leakage level; and
reducing the drain voltage to about zero after the drain current has been reduced to the leakage level.

12. The method of claim 10, wherein the corresponding plurality of gate voltages ranges from a negative bias to a positive bias.

13. The method of claim 10, wherein determining the first value for the plurality of device parameters after the first period further comprises:
measuring the drain current over a plurality of drain voltages at each of a corresponding plurality of gate voltages; and
measuring the gate current over a plurality of drain voltages at each of a corresponding plurality of gate voltages.

14. The method of claim 13, wherein determining the first value for the plurality of device parameters after the first period further comprises:
measuring the drain current over the plurality of drain voltages while holding the gate voltage at a value used during operation of the device over the first period; and
measuring a third plurality of S-parameters at each corresponding drain voltage of the plurality of drain voltages.

15. The method of claim 14, wherein determining the first value for the plurality of device parameters after the first period further comprises:
measuring the drain current over the plurality of gate voltages while holding the drain voltage at a value used during operation of the device over the first period; and
measuring a fourth plurality of S-parameters at each corresponding gate voltage of the plurality of gate voltages.

16. The method of claim 15, wherein determining the first value for the plurality of device parameters after the first period further comprises:
measuring the drain current over a second plurality of drain voltages up to about a turn-on level of the device; and
measuring a fifth plurality of S-parameters at each corresponding drain voltage of the second plurality of drain voltages.

17. The method of claim 16, wherein determining the first value for the plurality of device parameters after the first period further comprises:
calculating the first value for the plurality of device parameters by providing one or more of the measured one or more characteristics, the first plurality, the second plurality, the third plurality, the fourth plurality or the fifth plurality of S-parameters to one or more models used to describe the device under one or more conditions.

18. An apparatus for testing a device, comprising:
a testing platform for testing a device when present on the testing platform, the testing platform having one or more power supplies for providing power to the device and a first switch to couple to an input of the device and a second switch to couple to an output of the device, wherein the first and second switches switch the testing platform between a first mode and a second mode;
an RF power source coupled to the testing platform via the first switch for use during the first mode; and
a vector network analyzer coupled to the testing platform via the first and second switches for use during the second mode, wherein the vector network analyzer is used to perform S-parameter measurements on a device when present on the testing platform.

19. The apparatus of claim 18, wherein the testing platform is a plurality of testing platforms, each testing platform having one or more power supplies for providing power to a device and a first switch to couple to an input of the device and a second switch to couple to an output of the device, wherein the first and second switches switch the testing platform between a first mode and a second mode, and further comprising:

an RF power divider to divide RF power provided by the RF power source to each of the plurality of testing platforms via each of the plurality of first switches;
a input switch to couple an output of the vector network analyzer to each of the plurality of first switches of each of the plurality of testing platforms; and
a output switch to couple an input of the vector network analyzer to each of the plurality of second switches of each of the plurality of testing platforms.

20. The apparatus of claim 18, where the testing platform further comprises:
a first matching network disposed between the first switch and the input of the device when present on the testing platform; and
a second matching network disposed between the second switch and the output of the device when present on the testing platform.

* * * * *